United States Patent
Lee et al.

(10) Patent No.: US 12,370,576 B2
(45) Date of Patent: Jul. 29, 2025

(54) CHIP-ON-ARRAY WITH INTERPOSER FOR A MULTIDIMENSIONAL TRANSDUCER ARRAY

(71) Applicant: Siemens Medical Solutions USA, Inc., Malvern, PA (US)

(72) Inventors: Baik Woo Lee, Issaquah, WA (US); Stephen R. Barnes, Bellevue, WA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 57 days.

(21) Appl. No.: 18/045,854

(22) Filed: Oct. 12, 2022

(65) Prior Publication Data

US 2023/0066356 A1    Mar. 2, 2023

Related U.S. Application Data

(62) Division of application No. 16/181,464, filed on Nov. 6, 2018, now Pat. No. 11,498,096.

(51) Int. Cl.
*B06B 1/06* (2006.01)
*H10N 30/05* (2023.01)
(Continued)

(52) U.S. Cl.
CPC .............. *B06B 1/064* (2013.01); *H10N 30/05* (2023.02); *H10N 30/071* (2023.02);
(Continued)

(58) Field of Classification Search
CPC ...... B06B 1/064; H10N 30/05; H10N 30/071; H10N 30/088; H10N 30/302; H10N 30/50; H10N 30/871
See application file for complete search history.

(56) References Cited

U.S. PATENT DOCUMENTS 5,629,578 A * 5/1997 Winzer ................. B06B 1/0614
310/334
7,304,415 B2   12/2007 Petersen et al.
(Continued)

FOREIGN PATENT DOCUMENTS

CN        101102853 A        1/2008
CN        113948505 A *      1/2022   ........... A61B 8/4444
(Continued)

OTHER PUBLICATIONS

Wildes, Douglas, et al. "4-D ICE: A 2-D array transducer with integrated ASIC in a 10-Fr catheter for real-time 3-D intracardiac echocardiography." IEEE transactions on ultrasonics, ferroelectrics, and frequency control 63.12 (2016): 2159-2173.

*Primary Examiner* — Jeffrey T Carley (57) ABSTRACT

In a chip-on-array approach, acoustic and electronic modules are separately formed. The acoustic stack is connected to one interposer, and the electronics are connected to another interposer. Different connection processes (e.g., using low temperature bonding for the acoustic stack and higher temperature-based interconnect for the electronics) may be used. This arrangement may allow for different pitches of the transducer elements and the I/O of the electronics by staggering vias in the interposers. The two interposers are then connected to form the chip-on-array.

15 Claims, 4 Drawing Sheets

FIG. 1

(51) Int. Cl.
    *H10N 30/071*     (2023.01)
    *H10N 30/088*     (2023.01)
    *H10N 30/30*     (2023.01)
    *H10N 30/50*     (2023.01)
    *H10N 30/87*     (2023.01)
    *G01S 7/52*     (2006.01)
    *G01S 15/89*     (2006.01)

(52) U.S. Cl.
    CPC ......... *H10N 30/088* (2023.02); *H10N 30/302* (2023.02); *H10N 30/50* (2023.02); *H10N 30/871* (2023.02); *G01S 7/5208* (2013.01); *G01S 15/8925* (2013.01)

(56) References Cited

U.S. PATENT DOCUMENTS

| | | | | |
|---|---|---|---|---|
| 7,449,900 B2 * | 11/2008 | Yamagishi | ......... | G01R 31/2886 324/762.01 |
| 8,278,752 B2 * | 10/2012 | Roberts | ............. | H01L 23/49833 257/692 |
| 8,659,212 B2 | 2/2014 | Eggen et al. | | |
| 8,754,574 B2 | 6/2014 | Morris et al. | | |
| 9,180,490 B2 | 11/2015 | Tai | | |
| 10,944,041 B1 * | 3/2021 | Tsai | ....... | H10N 39/00 |
| 11,062,975 B2 * | 7/2021 | Lai | ......... | H01L 23/16 |
| 11,134,918 B2 * | 10/2021 | Wodnicki | ............ | B06B 1/0685 |
| 2003/0013969 A1 * | 1/2003 | Erikson | ................. | B06B 1/0629 600/459 |
| 2006/0133198 A1 * | 6/2006 | Fisher | ............... | H01L 27/14601 367/13 |
| 2010/0317972 A1 * | 12/2010 | Baumgartner | ....... | G10K 11/002 600/459 |
| 2012/0133001 A1 * | 5/2012 | Tkaczyk | ............. | A61B 8/4483 438/66 |
| 2013/0257224 A1 * | 10/2013 | Wodnicki | ............. | B06B 1/0622 29/25.35 |
| 2013/0315035 A1 | 11/2013 | Tai | | |
| 2015/0364457 A1 * | 12/2015 | Chen | ................. | H01L 25/0657 438/109 |
| 2016/0271651 A1 | 9/2016 | Petersen et al. | | |
| 2016/0375466 A1 * | 12/2016 | Shikata | ................. | G01N 29/32 310/327 |
| 2020/0391245 A1 * | 12/2020 | Barrett | ................... | H10N 30/06 |

FOREIGN PATENT DOCUMENTS

| | | | |
|---|---|---|---|
| JP | 2016154240 A | 8/2016 | |
| JP | 2018518057 A | 7/2018 | |
| KR | 20110031406 A | 3/2011 | |
| KR | 20130094751 A | 8/2013 | |
| WO | WO-2008038183 A1 * | 4/2008 | ........... B06B 1/0622 |
| WO | 2017222969 A1 | 12/2017 | |

\* cited by examiner

CHIP-ON-ARRAY WITH INTERPOSER FOR A MULTIDIMENSIONAL TRANSDUCER ARRAY

RELATED APPLICATION

This application is a divisional of U.S. application Ser. No. 16/181,464, filed Nov. 6, 2018, which is hereby incorporated by reference in its entirety.

BACKGROUND

The present embodiments relate to interconnection of multidimensional transducer arrays with electronics. Achieving the interconnection between an acoustic array and the associated transmit and/or receive electronics is a technological challenge for multidimensional (matrix) transducers. Hundreds or thousands (e.g., up to 10,000) of different elements distributed in two dimensions (azimuth and elevation) require interconnection along the z-axis (depth or range) for at least the elements surrounded by other elements. Since the elements are small (e.g., 250-500 µm), there is limited space for separate electrical connection to each element.

There are three approaches to provide interconnection for the multidimensional transducer array: chip-on-array, frame-based approach, and multi-layered flex. In the chip-on-array, the acoustic array is built-up directly on an application specific integrated circuit (ASIC) chip's input/output (I/Os). In principle, this approach provides the shortest electrical interconnections between acoustic elements and electronics, leading to desirably low electrical parasitics. Due to possible failure in the array or electronics, a very low process yield may result. The acoustic elements cannot be tested until formation on the electronics is completed. Since the acoustic array is built up on top of expensive electronics, the loss of the acoustic array leads to the loss of the expensive electronic module.

In the frame-based approach, the array is divided into a few sections (e.g., 4). Each section has a solid metal frame. Flex circuits bent around the metal frames redistribute as many signals as a number of acoustic elements from the acoustic elements to ASICs placed on the flex circuits. Signal routing of the frame-based approach is more complicated than chip-on-array, resulting in higher electrical parasitics. Since acoustic elements are built on separate flex circuits, better process yields and testability for both acoustic and electronics are provided.

The multi-layered flex approach stacks as many flex circuits (e.g., up to 9 layers) to route the signals for many elements (e.g., up to 9,000 acoustic elements) without any aperture sectioning. Compared to the chip-on-array or frame-based approaches, this multi-layered flex may be bent for use as a curved matrix array. The routing results in high electrical parasitics due to the multiple flex circuits and long traces on each flex.

SUMMARY

By way of introduction, the preferred embodiments described below include methods, systems and components for connecting electronics with an array of transducer elements. In a chip-on-array approach, acoustic and electronic modules are separately formed. The acoustic stack is connected to one interposer, and the electronics are connected to another interposer. Different connection processes (e.g., using low temperature bonding for the acoustic stack and higher temperature-based interconnect for the electronics) may be used. This arrangement may allow for different pitches of the transducer elements and the I/O of the electronics by staggering vias in the interposers. The two interposers are then connected to form the chip-on-array.

In a first aspect, a multidimensional transducer array system is provided. An acoustic array has transducer elements distributed in a grid over two dimensions. A first interposer is bonded to the acoustic array with a material bonding at a temperature below a Curie temperature of the transducer elements. An integrated circuit has transmit and/or receive circuits for ultrasound scanning with the acoustic array. A second interposer is bonded to the integrated circuit with material bonding at a temperature above the Curie temperature of the transducer elements. Vias formed in the first and second interposers electrically connect the transducer elements to the integrated circuit.

In a second aspect, an ultrasound transducer probe is provided. A chip-on-array arrangement includes a semiconductor chip electrically connected to a multi-dimensional transducer array through an interposer formed from multiple layers. Vias in the layers form the electric connections of the multi-dimensional transducer array to the semiconductor chip. The vias are patterned to alter a pitch from a first pitch of the multi-dimensional transducer array to a second, different pitch of connection pads of the semiconductor chip.

In a third aspect, a method is provided for connecting electronics with an array of acoustic elements. A first sheet of material with first vias is connected to a transducer stack. A second sheet of material with second vias is connected to an integrated circuit for ultrasound transmit and/or receive operation. Then, the first sheet of material as connected to the transducer stack is bonded with the second sheet of material as connected to the integrated circuit.

The present invention is defined by the following claims, and nothing in this section should be taken as a limitation on these claims. Further aspects and advantages of the invention are discussed below in conjunction with the preferred embodiments and may be later claimed independently or in combination. Different embodiments may achieve or fail to achieve different objects or advantages.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

For electrical connection of a multidimensional (e.g., matrix) array transducer, a chip-on-array is provided with an interposer. The interposer is formed from flex circuits or other material placed in between the electronics (e.g., ASIC) and the acoustic elements of the array. The electrical interconnections of acoustic array-to-interposer and electronics chip-to-interposer are formed separately using processes and resulting layer arrangements specific to the module (e.g., acoustic array and electronics modules). The electrical interconnections of interposer-to-interposer are then formed from the separately formed modules. This ultrasound transducer architecture for the integration of acoustic and electronic modules for the multi-dimensional matrix array transducer may provide minimized electrical parasitics, separate testability on both acoustic and electronic modules, better process yield for ultrasound transducer manufacturing, higher thermal budget for some interconnections, and improved reliability for the electronic module, all of which can reduce the overall cost.

Due to the short electrical path through the vias, a lower electric parasitic is provided. Each acoustic element is electrically interconnected to its corresponding ASIC's I/Os through a few number (e.g., 2-4) of stacked vias within interposer flex circuits. The height of each via is very low so that electrical interconnections from acoustic elements and ASIC is short, resulting in lower electrical parasitics compared to a frame-based and multi-layered flex approaches.

The acoustic and electric flex circuits (interposers) may have staggered vias. The staggered vias provide more flexibility in I/O pitches relative to transducer element pitches and positions for electrical interconnections between acoustic and electrical modules in chip-on-array for an ultrasound transducer.

Two or more smaller sized chips may be mounted on to the flex circuits (chip tiling) instead of single large expensive ASIC chip. This arrangement allows for smaller, less expensive integrated circuits.

Low temperature bonding may be used for the acoustic module, and high temperature interconnection may be used for electronic module. For the acoustic module, low temperature and low-pressure bonding layers is used. The acoustic module may be formed by one-step bonding of the layers of the transducer stack together and of the interposer. A low temperature (e.g., <120° C.) curable polymer (e.g., epoxy) is used to connect the acoustic module. The thermal budget of the acoustic module is limited to below Curie temperature of piezoelectric layers (e.g., binary single piezo-crystal <80° C. or ternary single piezo-crystal <120° C.) or other breakdown temperature. High temperature (e.g., >120° C.) interconnection may be used for the electronics module, providing more reliable interconnections for ASIC connections and/or connections of passive components (e.g., capacitor, resistor, and/or inductors). High temperature reliable electrical interconnections (>120° C.) for the electronic module include lead and lead-free solder (>180° C.), Cu pillar with solder cap (>250° C.), and high temperature anisotropic conductive film (ACF) (>120° C.). Since each module is built on separate interposers, the acoustic module may be formed by one-step bonding with a low temperature curable polymer, and at the same time higher thermal budget is available on the electronic module.

Since the acoustic module and electronics module are connected to interposers separately from each other, the modules may be separately tested. The parallel process of acoustic and electronic module formation on separate interposer flex circuits allows testing for each module before assembly together. Only good modules after testing are used to form the full assembly of the ultrasound transducer. Better process yield for manufacturing may result as the loss of one module is not accumulated on top of failure of another module.

Figure 1:
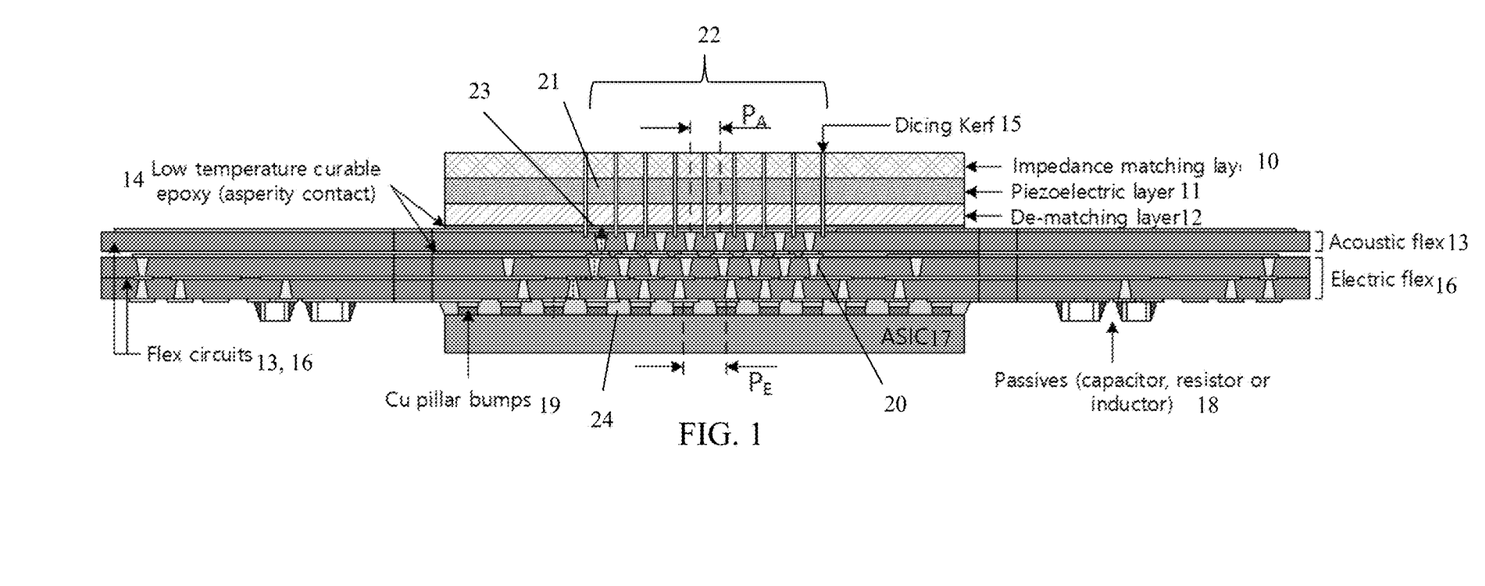
FIG. 1 is a cross-section view of one embodiment of a chip-on-array interconnection of an acoustic array with an integrated circuit.

FIG. 1 is a cross-section view of one embodiment of a multidimensional transducer array system. The system is used for an ultrasound transducer probe, such as in a handheld probe for scanning from an exterior of a patient or a intra-cavity or catheter-based probe for scanning from within a patient. The system is a chip-on-array arrangement where a semiconductor chip electrically connects to a multi-dimensional transducer array through an interposer formed from multiple layers. Due to short electrical connections, improved scanning and imaging with ultrasound may be provided for medical diagnosis.

Figure 5:
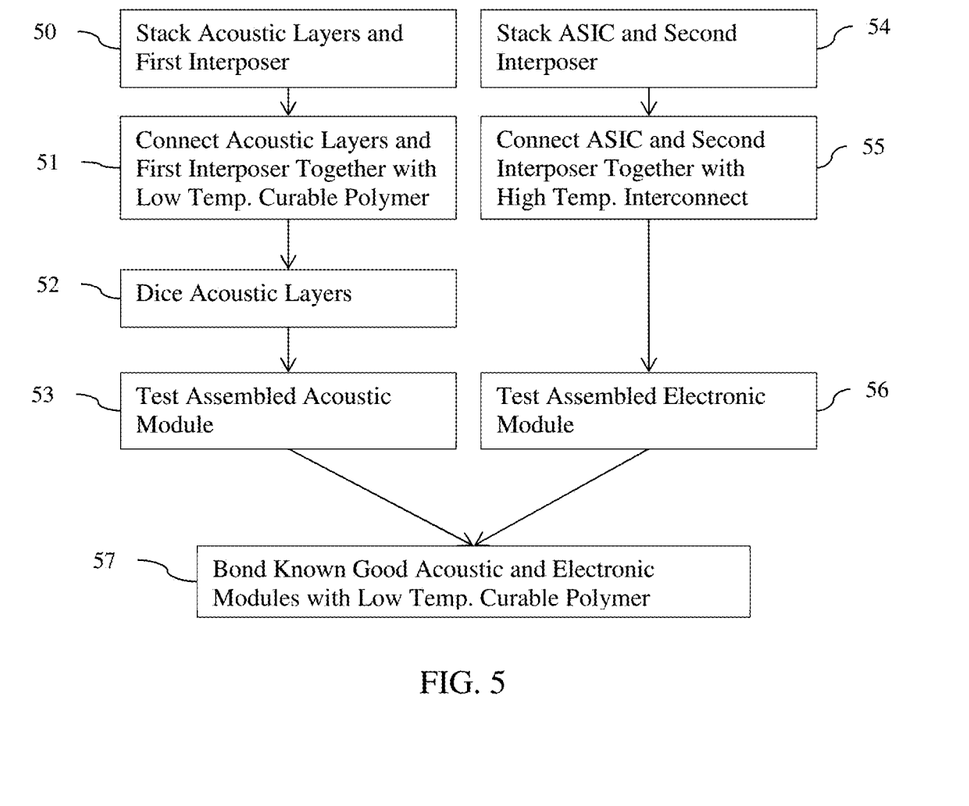
FIG. 5 is a flow chart diagram of one embodiment of a method for connecting electronics with an array of acoustic elements.

The array system and corresponding probe are formed using the method of FIG. 5 or another method. The array system includes an acoustic module formed from a transducer stack (e.g., matching layer 10, piezoelectric layer 11, and de-matching layer 12) and at least one interposer 13 and an electronics module formed from an integrated circuit 17 and at least one interposer 16. Additional modules may be included.

The acoustic module includes an acoustic array 22 having transducer elements 21 distributed in a grid over two dimensions. The multidimensional transducer array 22 is an array of piezoelectric or microelectromechanical (capacitive membrane) elements 21. Piezoelectric examples are used herein. The array 22 is flat, concave or convex. The elements 21 are distributed along two dimensions. The elements 21 are distributed along any of various pitches, such as every 250, 400 or 500 micrometers, in a fully sampled spacing along two dimensions. In FIG. 1, the pitch of the transducer elements 21 is shown as pitch $P_A$. Other pitches or a pitch that varies as a function of location may be used. The pitch may be the same or different in different directions or dimensions, such as 300 micrometers along elevation and 600 micrometers in azimuth. Full or sparse sampling of placement of the elements 21 is provided.

The array 22 and corresponding transducer elements 21 include one or more impedance matching layers 10, a piezoelectric layer 11, and a de-matching layer 12. Each of the elements 21 of the array 22 includes at least two electrodes. The elements transduce between electrical and acoustical energies. Additional, different, or fewer layers may be provided. For example, a backing block may be positioned on one side of the array 22 for limiting acoustic reflection from energy transmitted in an undesired direction. A lens, a window, or other now known or later developed multidimensional transducer array components may be included.

The matching layer 10 is a ¼ wavelength thickness layer of material. The material has an acoustic impedance between the impedance of the piezoelectric layer 11 and the patient. Multiple layers for a gradual change in acoustic impedance may be used.

The piezoelectric layer 11 is a slab or plate of piezoelectric material. A solid piezoelectric may be used. Single or poly-crystal piezoelectric material may be used. In other embodiments, a composite of piezoelectric and epoxy or another polymer is used.

The de-matching layer 12 is a ¼ wavelength thickness layer of material. Any material may be used, such as tungsten carbide. The de-matching layer 12 provides a clamped boundary condition, leading to better sensitivity and wider bandwidth in the ultrasound transducer.

A grounding plane may form one electrode. The grounding plane may be provided by a conductive matching layer 10. Alternatively, a sheet of conductor is placed or deposited on, within, or below the matching layer 10.

Another sheet of conductor provides conductors to form the signal electrodes 23. Conductor deposited on the interposer 13 may be used. Alternatively, conductor placed or formed on the piezoelectric layer 11 is positioned between the piezoelectric layer 11 and the de-matching layer 12. In yet other embodiments, the conductor is formed by conductive material of the de-matching layer 12. Once diced or separated, the sheet of conductor provides signal electrodes 23 for the transducer elements 21. An electrically separate signal electrode 23 is provided for each transducer element 21.

The interposer 13 is an electrically insulating or dielectric material. In one embodiment, the interposer 13 is formed from a sheet of flexible circuit material, such as a polyimide. Traces or other conductors may be included on and/or in the material of the interposer 13, such as deposited and/or etched copper traces. Passive and/or active electronics may be attached. Since the flexible circuit material is placed between the electronics chip (e.g., ASIC 17) and the acoustic array 22 to provide signal routings or distributions for electrical interconnection, the material is an interposer.

The interposer 13 connects with the acoustic stack to form the acoustic module. The physical connection is by bonding, so a layer of bonding material is provided. In the example of FIG. 1, the bonding material is epoxy layer 14. The epoxy layer 14 holds the interposer 13 to the acoustic stack, such as holding the interposer 13 to the de-matching layer 12.

Any material for bonding may be used. In one embodiment, the material is a low-temperature curable polymer, such as epoxy, polyurethane, polyester, Ag paste, or other polymer-based material. Low temperature is relative to the transducer elements 21. The Curie temperature of the piezoelectric layer 11 may be between 80-120° C. For example, a binary single piezo-crystal has a Curie temperature of 80° C., and a ternary single piezo-crystal has a Curie temperature of 120° C. Other Curie temperatures may be provided. Other temperatures related to change in operation or breakdown of any of the layers in the acoustic stack may be used. Reaching or exceeding the temperature is undesired in forming the acoustic module. The material for bonding or other interconnection allows for connection without exceeding the low temperature.

Asperity contact is provided from the signal electrodes to traces, vias 20, or other conductors on the interposer 13. The interposer 13 is stacked with the de-matching layer 12. The other layers 10, 11 of the transducer may be previously bonded together or unbonded. The material for bonding is added to or during the stacking. The material may cure at room temperature or an elevated temperature below the Curie temperature or other breakdown temperature. In one embodiment, the layers 10, 11, 12, and the interposer 13 are stacked and bonded at a same time or as part of a same cure (i.e., one-step bonding) to form the acoustic module.

The interposer 13 includes a plurality of vias 20. A few vias 20 are shown in FIG. 1 as inverted triangles. On a single interposer 13, one via 20 is provided for each transducer element, but additional or fewer vias may be provided. The vias 20 are formed in the interposer 13, such as by etching, deposition, drilling, or molding. A conductor, such as copper, lines or fills a hole to create a conductive path through a thickness of the interposer 13. This via 20 provides an electrically conductive path from one side of the interposer 13 to the other side, such as to allow electrical connection from the signal electrodes of the elements 21 to the electronics module (e.g., integrated circuit 17) in the chip-on-array arrangement.

The vias 20 are positioned to connect with the signal electrodes. Where the vias 20 are at a same pitch $P_A$ as the signal electrodes and corresponding transducer elements 21, the vias 20 are aligned with the signal electrodes. In the example of FIG. 1, the vias 20 of the interposer 13 for the acoustic module have a same pitch. The pitch of the vias 20 may be different than the pitch $P_A$ of the signal electrodes. In this case, a trace or pad is formed on the interposer 13 to route signals from the signal electrodes to the vias 20. Alternatively, the vias 20 are angled so that the pitch $P_A$ is provided on the surface adjacent to the signal electrodes and a different pitch is provided on the opposite surface of the interposer 13.

Once aligned and bonded, the signal electrodes electrically connect to the vias 20 of the interposer 13. This provides for z-axis routing of signals from the transducer elements 21 to or from the electronics module. The assembled acoustics module includes the bonding material used to physically hold the interposer 13 to the transducer elements 21 with electrical connection by asperity contact.

The electronics module includes the electronics (e.g., integrated circuit 17 and/or passive electronics 18) and one or more interposers 16. Additional, different, or fewer components may be provided in the electronics module.

The passive electronics 18 are discrete components, such as resistors, capacitors, and/or inductors. Other or no passive electronics may be used.

The active electrical components are semiconductors, such as transistors devices. "Active" electrical component is used to convey a type of device rather than operation of the device. Transistor based, or switch-based devices are active while resistors, capacitors or inductors are passive devices. The active electrical devices are one or more integrated circuits 17, such as an ASIC. The integrated circuit 17 may be an application specific integrated circuit, analog circuit, digital circuit, switch, multiplexer, controller, processor, digital signal processor, field programmable gate array, or other now known or later developed active electrical component. The integrated circuit 17 may be in a chip form as an integrated circuit.

The semiconductors or active electronics include transmit and/or receive circuits for ultrasound scanning with the acoustic array 22. For example, a plurality of transmit circuits are provided as semiconductors chips, a plurality of receive circuits are provided as semiconductor chips, and a controller is provided as a semiconductor chip. The transmit components are separate from or may be integrated with the receive components. Transmit components include high voltage pulsers, filters, memories, delays, phase rotators, multipliers, combinations thereof or other now known or later developed transmit beamformer component. The receive components include filters, amplifiers, delays, summers, combinations thereof or other now known or later developed receive beamformer component. Since receive beamformer components may operate at lower voltages than the transmit components, the receive and transmit components are separate devices, but a combination device for the transmit and receive operation may be provided. The integrated circuit 17 includes all or part of a transmit beamformer, pulsers, receive beamformer, amplifiers, phase rotators, delays, summers, or other active electronics used for ultrasound scanning.

Figure 2:
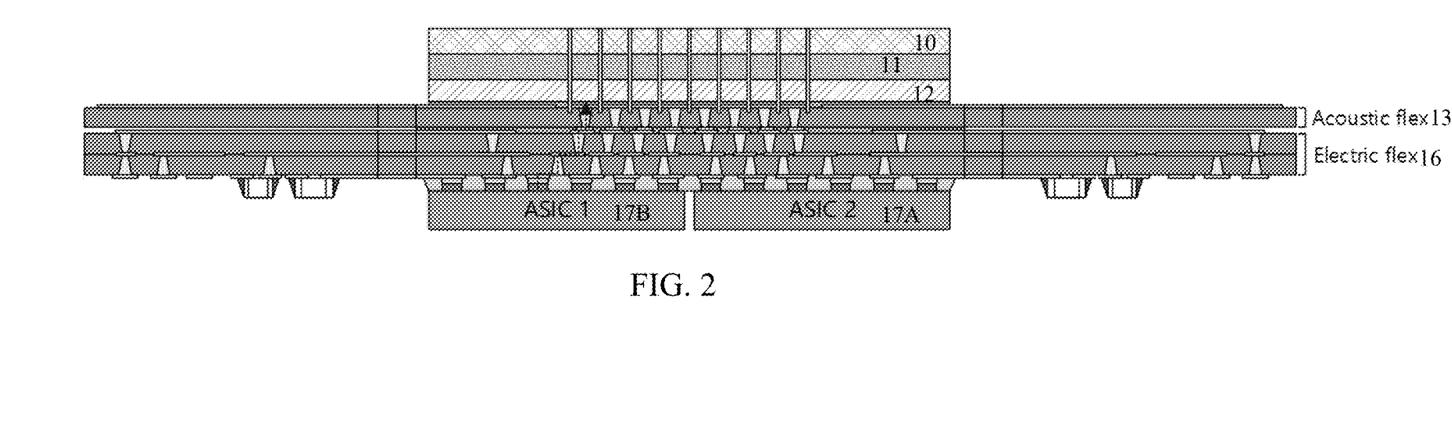
FIG. 2 is a cross-section view of another embodiment of a chip-on-array interconnection of an acoustic array with an integrated circuit.

In one embodiment, a single active electrical component, such as a single chip or ASIC 17, is provided as shown in FIG. 1. A larger number of acoustic elements 21 and corresponding aperture result in a larger sized ASIC chip to handle the acoustic signals. A larger ASIC chip is more expensive since the larger chip has more chances to have defects during semiconductor processing. To reduce the size of the integrated circuit 17, two or more integrated circuits 17 may be tiled. FIG. 2 shows an example where two semiconductor chips or integrated circuits 17A, 17B are used. Two or more semiconductors may be tiled or placed adjacent each other. Each semiconductor or integrated circuit 17 is positioned adjacent to the interposer 16. Two or more smaller sized chips are mounted on to the interposer 16 (e.g., flex circuits) instead of a single large expensive ASIC chip. Each integrated circuit 17A, B electrically connects with different sub-sets of the transducer elements 21. For example, four ASICs 17 electrically connect to four groups of elements 21 where each element is in only one group.

The semiconductor chip or integrated circuit 17 includes input/output pads. The semiconductor chip includes input/output conductors exposed on a largest surface. In alternative embodiments, the pads exit the chip alongside edges and are routed by wire bond or flexible circuit to a distribution on the largest surface. In other alternative embodiments, the interposer 16 routes to the conductors on the sides of the chip.

The input/output pads are conductors formed on the integrated circuit 17. Cu pillars, electrodes, traces, vias, or other conductive structures may be used for the input/output pads.

The input/output pads have a pitch, $P_E$. The pitch may be the same as the pitch $P_A$ of the transducer elements 21. Alternatively, the pitch of the input/output pads is different. For example, FIG. 1 shows the pitch $P_E$ of the ASIC 17 as different than the pitch $P_A$ of the transducer elements 21 along one dimension (e.g., azimuth). The pitch is the same or different along a perpendicular dimension (e.g., elevation). In a Cartesian grid, the pitch $P_A$ may be 500 micrometers and the pitch $P_E$ may be 400 micrometers. Other pitches may be used for either the elements 21 or the pads. The pitches $P_A$, $P_E$ may be different while the transducer elements 21 and input/output pads are both in a same regular grid pattern. In other embodiments, the pattern of distribution of the transducer elements 21 is different than the pattern of distribution of the input/output pads.

The interposer 16 for the electronics module is the same or different material as the interposer 13 for the acoustic module. For example, the interposer 16 is formed from a polyimide or flexible circuit material. The thickness is the same or different as the interposer 13 of the acoustic module.

Any number of interposers 16 may be provided. In the example of FIG. 1, there are two interposers 16 stacked together or in asperity contact with each other. Only one, three, or more interposers 16 may be provided.

As manufactured, the electronics module includes layers or structures of material for holding the interposers 16, passive electronics 18, and/or integrated circuits 17 together. The interposer 16 is bonded to the integrated circuit 17 by the material. The material holds the interposer 16 to the integrated circuit 17 and/or interposer 16 to another interposer 16 as a physical connection. The material may additionally form an electrical connection between the input/output pads and the vias 20 and/or traces on the interposer 16.

The material bonds at a temperature above the Curie temperature of the transducer elements 21. Stronger asperity contact for the electrical connection and/or other electrical interconnection with better strength or electrical contact is formed due to being able to form the interconnection at a higher temperature. For example, an anisotropic conductive film (ACF) or solder is used. The material bonding is an interconnection that has been formed at a temperature greater than used for the acoustic module. For example, the interconnection is formed at a temperature greater than 80° C., 120° C., 180° C. or other temperature. In one embodiment, Cu pillar bump joints (e.g., Sn—Ag—Cu composition) with solder caps are used for ASIC chip interconnection with the interposer 16. The ASIC 17 is faced-down placed on to the substrate of the interposer 16. The joints are formed to the pads (cap of Cu pillar bump joints) of the interposer 16 by high temperature reflow to melt the solder cap, such as a temperature >250° C. ACF may use a temperature >120° C. Solder or solder bumps may use a temperature >180° C. After heating, the bonding material is formed bonding the interposer 16, as aligned, with the integrated circuit 17. The passive electronics 18 may be separately bonded or bonded as part of the same heating.

The interposer 16 includes a plurality of vias 20. The vias 20, with or without traces, electrically connect the transducer elements 21 of the array 22 to the semiconductor chip of the integrated circuit 17. The vias 20 extend through the thickness of the interposer 16 to provide for electrical connection. For electrical connection, vias 20 through all the interposers 13, 16 provide the electrical connection. For each element, the signal electrode connects with a via 20 of the interposer 13 of the acoustic module, the via 20 of the interposer 13 of the acoustic module connects with a via 20 of the interposer 16 of the electronics module, and the via 20 of the interposer 16 of the electronics module connects with an input/output pad of the integrated circuit 17. Other via 20-to-via 20 connections may be provided where other interposer layers are provided. Traces or other conductors on or in the interposers 13 and/or interposers 16 may be used for routing the interconnection.

Where the element pitch $P_A$ is the same as the input/output pad pitch $P_E$ and elements 21 are aligned with the input/output pads, the vias 20 are aligned and at a same pitch on each layer of interposer 13, 16. Where the element pitch $P_A$ and the input/output pad pitch $P_E$ are different or the elements 21 are not aligned with the pads, staggered vias 20 may be used in one or more of the interposers 13, 16. Staggering the vias 20 offsets the vias by angling and/or placement, resulting in a different pitch and/or pattern of the vias 20 than vias 20 of another interposer 13, 16, the element pitch $P_A$, and/or the pad pitch $P_E$. FIG. 1 shows an example with the vias 20 of the interposer 13 of the acoustic module are at the element pitch $P_A$, but the vias 20 of both interposers 16 of the electronic module are at different pitches than each other, the element pitch $P_A$, and the pad pitch $P_E$. Other arrangements may be used with vias 20 in the interposers 13, 16 having a same or different pitch than other interposers 13, 16, the elements 21, and/or the pads. Some vias 20 in a given interposer 13, 16 may be staggered while others are not relative to other pitches.

The interposers 13, 16 having staggered vias 20 provide signal routings to match the electric I/Os from ASIC 17 or multiple ASICs 17A, 17B to corresponding acoustic I/Os (signal electrodes) of the multi-dimensional array 22. The staggering adjusts the electrical connections from the transducer elements 21 at the element pitch $P_A$ to the input/output pads at the pad pitch $P_E$. Acoustic and electric interposers 13, 16 (e.g., flex circuits) having staggered vias 20 provide more flexibility in I/O pitches and positions for electrical interconnections between acoustic and electrical modules in chip-on-array for the ultrasound transducer. The acoustic pitch ($P_A$) does not need to be matched to electrical pitch ($P_E$) and further, each electric I/O does not need to be placed right below corresponding acoustic I/O, providing more flexibility and freedom in ASIC developments and choices.

Any number of interposers 13, 16 may be included. Additional interposers 13 may be provided in the acoustic module. Due to more reliable interconnection that may be provided by higher temperature and/or to reduce thermal stress on the acoustic stack, the additional interposers 16 may be bonded as part of the electronics module. Based on any via staggering and alignment, electrical connection through the thickness of the additional interposer 16 and, if needed, along or within the interposer 16, is formed by interconnecting.

The acoustic module is bonded to the electronics module. The outer interposers 13 and 16 of the formed acoustic and electronics modules are interconnected. Since the transducer stack is included in the acoustic module, the interconnection uses material bonding at a temperature below the Curie temperature of the transducer elements 21 or a breakdown temperature. The temperature used for curing or forming the interconnection is the same or different than the temperature used to form the interconnection for the acoustic module. The same or different material than used to form the acoustic module is used to bond the modules together. For example, the acoustic module is formed using an epoxy, and the modules are bonded together using Ag paste or epoxy. Epoxy and Ag paste use lower temperature and pressure to bond than ACF does. The low-pressure bonding may minimize the breakage of the ASIC 17 and acoustic module during bonding of the two interposers 13, 16 (e.g., flex sheets) to each other.

The formed array system is placed in a housing and electrically connected to cables or other conductors for signaling with an ultrasound scanner or image processor. Where the interposers 13, 16 are formed of flexible material, the interposers 13, 16 extending beyond the integrated circuit 17 may be bent or shaped. Where multiple integrated circuits 17A, 17B are used, a curvature at the array 22 may be used.

Figure 3:
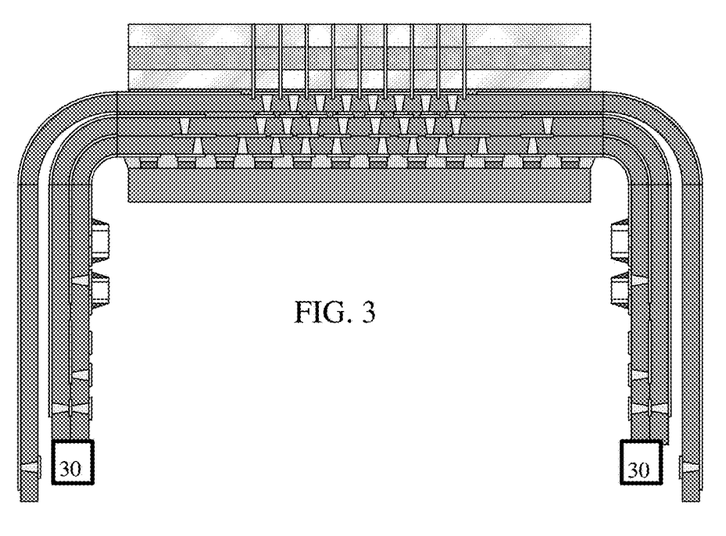
FIG. 3 shows example shaping of the chip-on-array system for use in a transthoracic echocardiogram (TTE) probe.
Figure 4:
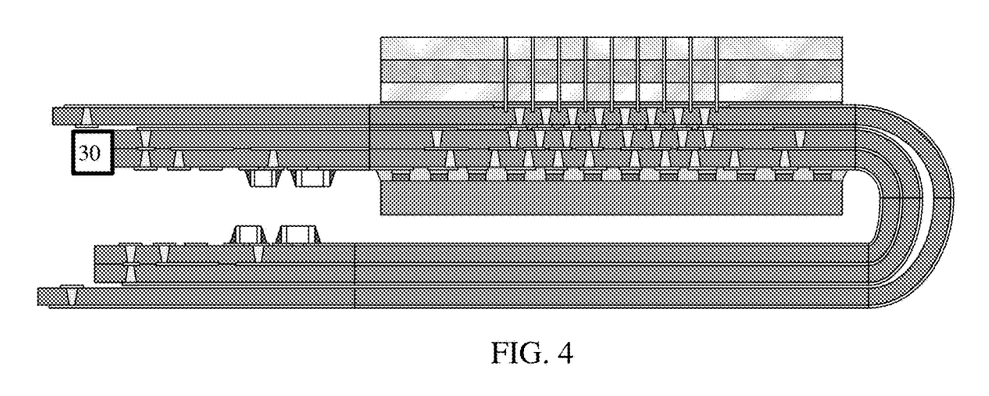
FIG. 4 shows example shaping of the chip-on-array system for use in a intracardiac echocardiography (ICE) catheter probe.

FIG. 3 shows an example where the interposers 13, 16 are laid over a frame or shaped for fitting in a transthoracic echocardiography (TTE) probe. FIG. 4 shows an example where the interposers 13, 16 are folded for fitting into a catheter (e.g., an intracardiac echocardiography catheter). Other probes, corresponding housings, and/or shapes may be used, such as a handheld probe.

To control scanning and/or to receive data from scanning to generate an image of a patient scanned with the array 22, signals are provided to or from the system. In one embodiment, one or more connectors 30 on the interposers 13 and/or 16 connect with cables or other conductors. Traces on the interposers 13 and/or 16 route signals (e.g., via traces and/or vias) to or from the integrated circuit 17 to control the scanning and/or to receive ultrasound data from the scanning. Alternatively, input/output pads of the integrated circuit 17 connect with cables, a flexible circuit, wires, or other conductors separately from the interposer 16 for signaling with an image processor or ultrasound scanner.

FIG. 5 shows a flow chart of one embodiment of a method for connecting electronics with a multidimensional or other array 22 of acoustic elements 21. The acoustic and electronics modules with corresponding interposers are formed in parallel or separately, allowing for separate testing. The modules then connected together. The method forms the array system of FIG. 1, FIG. 2, FIG. 3, FIG. 4, or another array system.

The method is implemented as a manufacturing of the array system and/or probe. A technician or robot stacks and aligns, such as using guide posts or a frame. An oven, iron, induction solderer, or wave bath is used to bond or interconnect. A frame, housing, or holder are used to shape and position in a probe housing.

Additional, different, or fewer acts may be used. For example, act 52 for dicing is not performed where the transducer stack is previously kerfed. As another example, the acoustic stack is bonded together prior to the connection with the interposer in act 51. In another example, acts 53 and/or 56 are not performed.

The acts are performed in the order shown or other orders. Acts 50-52 are performed independently of acts 54-55. This parallel processing to form the acoustic module (acts 50-52) and the electronics modules (acts 54-55) allows for forming the acoustic and electronics modules at a same time or in any order. The testing acts 53, 56 may be performed in any order, such as testing the acoustic module then the electronics module, vise versa, or testing at a same time while disconnected from each other.

In acts 50-52, the acoustic module is manufactured. In act 50, the acoustic layers and one or more interposers are stacked. Using posts and/or a frame, the layers of the acoustic module are aligned and positioned against each other. The layers of the transducer are stacked as not yet bonded together. Alternatively, the layers of the transducer are previously bonded together and stacked as a unit against the interposer.

Polymer, paste, or other material for bonding is added to the stack, such as between and/or around layers of the stack. For example, the bottom layer of the transducer (e.g., de-matching layer) and/or the interposer 13 are coated with epoxy. Other low temperature (e.g., below a Curie or breakdown temperature of part of the acoustic module) curable polymers may be used.

In act 51, the transducer layers (e.g., matching layer, piezoelectric layer, and de-matching layer) and the interposer are connected together. The stack is pressed together by a vise to form asperity contact for electrical connections.

The compressed stack is heated, such as being positioned in an oven. The temperature of the oven is below a lowest of the Curie temperature or breakdown temperature of any component of the stack. The heat increases the rate and/or strength of bonding. The heat may activate the bonding.

The connection forms the acoustic module. Asperity contact creates an electrical connection of the vias of the sheet of material of the interposer with the transducer stack (e.g., signal electrodes or planar conductor used to form the signal electrodes). The layers of the acoustic stack and interposer are bonded together.

Since the same bonding may be used for the transducer stack, the interposer is bonded as part of a one-step bonding. The same polymer and/or same curing (e.g., placement in the oven) event are used to connect. The curing for the layers of the transducer stack and the interposer are performed at a same time. Alternatively, the transducer stack is separately cured from the bonding of the interposer to the transducer stack.

In act 52, the transducer stack is diced. A saw or laser is used to form kerfs 15 (see FIG. 1) in the stack, separating the stack into transducer elements. The dicing forms the array of acoustic elements from the piezoelectric slab.

The dicing may extend into the interposer, such as to separate a conductive plane on the interposer into signal electrodes. Alternatively, the dicing and resulting kerfs 15 do not extend to the interposer.

Figure 6:
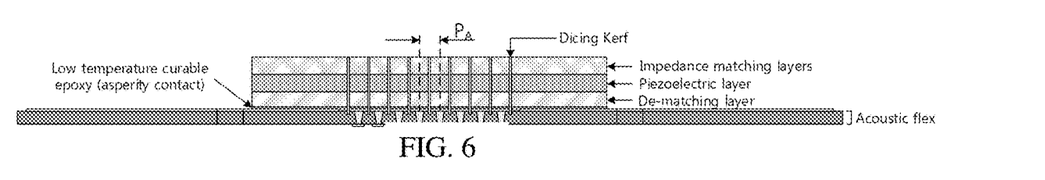
FIG. 6 is a cross-section view of one example of an acoustic stack connected to an interposer.

FIG. 6 shows an example formed acoustic module. A low temperature curable epoxy bonds the interposer (e.g., acoustic flex) to the diced transducer stack (e.g., de-matching layer).

In act 53, the assembled acoustic module is tested. After curing or forming the electrical interconnection of the acoustic module, the transducer array and interposer of the acoustic module are tested. The test may be for bonding strength or other physical test. The test may be for acoustic operation. For example, a test rig makes electrical contact with the vias of the sheet of material. Signals for each element resulting from acoustic energy applied to the transducer may be measured. Alternatively or additionally, signals are applied to the vias and a microphone or hydrophone measures acoustic energy generated in response. Other testing may be performed.

The testing is without the semiconductor or integrated circuit or another component of the electronics module. By testing separately, the acoustic module may be discarded if failing the test without also discarding the components of the electronics module.

In acts 54-55, the electronics module is manufactured. In act 54, the integrated circuit is stacked with one or more sheets of material with vias. Any number of interposers may be used. The chip and the sheets with vias are aligned using a frame and/or posts. The layers are stacked to form the electronics module.

Polymer or other material for interconnection physically and/or electrically is added to or provided on the stack. For example, Ag paste is deposited on the interposer and Cu pillars are provided on the integrated circuit. The Cu pillars are to be used to connect the chip to a first sheet of material. Ag paste is used to connect between sheets of material. Other combinations or using the same material may be used in other embodiments.

In act 55, the integrated circuit (e.g., ASIC chip or chips) is connected to the sheet of material or interposer (e.g., flexible circuit material). The stack is compressed, such as in a vise. The compression may form the interconnection, such as where Ag paste is used.

Heat is applied. For solder, heat is generated by an iron, induction solder, oven, or wave bath. For VCF or polymer, an oven or iron may be used. The heat forms the interconnection. Higher temperatures than allowed by the acoustic module may be used, such as forming reliable electrical bonding at greater than 120° C. Temperatures greater than a Curie temperature or breakdown temperature of any component of the acoustic module may be used. The interconnection is formed at the higher temperature. Lower temperatures may be used.

The same or different process is used to connect different sheets together. Multiple sheets and the chip or chips may be interconnected as part of a same cure or same application of heat (e.g., at a same time) where the same or even different material is used for forming the interconnection. Alternatively, one sheet is interconnected with the chip or chips at one period and then one or more other sheets are later interconnected.

Figure 7:
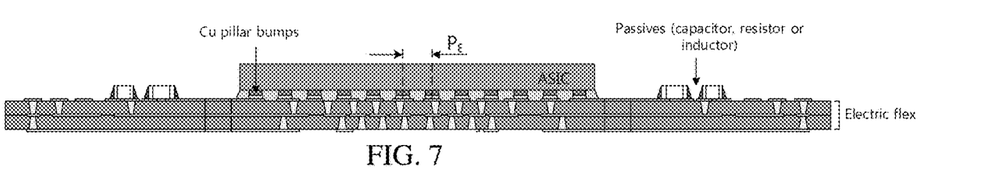
FIG. 7 is a cross-section view of one example of an integrated circuit connected to an interposer.

Once interconnected, the electronics module is provided. FIG. 7 shows an electronics module formed with solder connection using Cu pillar bumps for the chip to interposer and curable polymer or Ag paste for interposer-to-interposer.

In act 56, the assembled electronics module is tested. After curing or forming the electrical interconnection, the integrated circuit and interposer or interposers of the electronics module are tested. The test may be for bonding strength or another physical test. The test may be for electrical operation. For example, a test rig makes electrical contact with the vias of a sheet of material and any connectors. Test control signals are input and the resulting output signals to transducer elements at the vias are measured. Alternatively or additionally, signals are applied to the vias and the resulting output signals from the integrated circuit are measured. Other testing may be performed.

The testing is without the transducer array or other component of the acoustic module. By testing separately, the electronics module may be discarded if failing the test without also discarding the components of the acoustic module.

In act 57, the acoustic module is bonded or interconnected with the electronics module. The interconnection is formed after the testing of the modules in acts 53 and 56. Modules that have satisfactory test results are connected in act 57.

The connection is formed using a material that bonds at a low temperature (i.e., temperature below the Curie temperature or breakdown temperature of a component of the acoustic module). One sheet of material with vias is aligned with and bonded to another sheet of material with vias. The interposer of the acoustic module is bonded to the interposer of the electronics module.

The acoustic module is stacked with the electronics module. A polymer (e.g., epoxy or Ag paste) is positioned between the modules, such as being deposited or formed on one of the interposers. This curable polymer is heated. The stack of modules is placed in an oven or otherwise heated to cure. The temperature is limited to being below the Curie or breakdown temperature. Once cured, the modules are bonded to each other, forming the transducer system.

Using the vias of the sheets of material and electrical interconnection between layers (e.g., between the signal electrode and vias, via-to-via, and via-to-input/output pad of a chip), electrical interconnection from the transducer elements to the integrated circuit are provided. Soldering, asperity contact, and/or cured conductive paste electrically interconnect.

Based on the alignment, the electrical interconnections through the sheets of material allow for transition in pitch. The aligned layers are bonded to form electrical interconnections that transition between different pitches and/or layout patterns (e.g., grid formats).

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A method for connecting an integrated circuit with transducer stack, the method comprising:
   connecting a first sheet of material with first vias to the transducer stack, the first sheet comprising a first interposer part, the transducer stack comprising a matching layer and a piezoelectric layer, wherein connecting the first sheet to the transducer stack comprises bonding the matching and piezoelectric layers of the transducer stack together and the first sheet at a same time with a polymer curable at a temperature below a Curie temperature of the transducer stack;

connecting, at a temperature above the Curie temperature of the transducer stack, a second sheet of material with second vias to an integrated circuit for ultrasound transmit and/or receive operation, the second sheet comprising a second interposer part; and then bonding the first sheet of material as connected to the transducer stack with the second sheet of material as connected to the integrated circuit.

2. The method of claim 1 further comprising dicing the transducer stack as connected to the first sheet, the dicing forming an array of the acoustic elements.

3. The method of claim 2 wherein dicing comprises dicing the transducer stack, which dicing forms the array as a two-dimensional array of the acoustic elements.

4. The method of claim 1 wherein bonding the first sheet with the second sheet comprises bonding with additional polymer curable at a temperate below the Curie temperature of the transducer stack.

5. The method of claim 1 further comprising separately testing (1) the transducer stack as connected to the first sheet prior to the bonding of the first sheet with the second sheet and (2) the integrated circuit as connected to the second sheet prior to the bonding.

6. The method of claim 1 wherein bonding the first sheet with the second sheet comprises bonding with the first vias having a different pitch than the second vias, the bonding of the first sheet with the second sheet providing electrical connections of the transducer stack to the integrated circuit through the first and second vias.

7. The method of claim 1 wherein connecting the second sheet to the integrated circuit comprises connecting the second sheet to the integrated circuit comprising transmit and/or receive circuits for ultrasound scanning with an array formed from the transducer stack.

8. The method of claim 1 wherein bonding the first sheet with the second sheet comprises electrically connecting the transducer elements to the integrated circuit with the first and second vias.

9. The method of claim 1 wherein connecting the first sheet to the transducer stack comprises connecting with epoxy or Ag paste.

10. The method of claim 1 wherein connecting the second sheet to the integrated circuit comprises connecting with an anisotropic conductive film or solder.

11. The method of claim 1 wherein connecting the first sheet of material to the transducer stack comprises connecting the first vias to signal electrodes of the transducer stack.

12. The method of claim 1 wherein connecting the first sheet and connecting the second sheet comprise connecting to flexible circuit material as the first and second sheets.

13. The method of claim 1 further comprising stacking a third sheet between the first and second sheets, and wherein bonding the first sheet with the second sheet comprises bonding the third sheet with the first and second sheets.

14. The method of claim 1 wherein connecting the second sheet to the integrated circuit further comprises connecting the second sheet to another integrated circuit, wherein the first and second vias connect the multiple integrated circuits to different sub-sets of the acoustic elements.

15. The method of claim 1 wherein bonding the first sheet with the second sheet comprises bonding with the first sheet in asperity contact with the second sheet.

* * * * *